United States Patent
Ko et al.

(10) Patent No.: US 9,966,488 B2
(45) Date of Patent: May 8, 2018

(54) OPTICAL FILM WITH QUANTUM DOTS EMBEDDED IN NANO PATTERNS, A PREPARATION METHOD THEREOF AND SOLAR CELL COMPRISING THE SAME

(71) Applicant: KOREA INSTITUTE OF SCIENCE AND TECHNOLOGY, Seoul (KR)

(72) Inventors: Hyungduk Ko, Seoul (KR); Il Ki Han, Seoul (KR); Yong Hyeon Kim, Seoul (KR); Minsik Park, Seoul (KR)

(73) Assignee: KOREA INSTITUTE OF SCICENCE AND TECHNOLOGY, Seoul (KR)

( * ) Notice: Subject to any disclaimer, the term of this patent is extended or adjusted under 35 U.S.C. 154(b) by 81 days.

(21) Appl. No.: 15/015,595

(22) Filed: Feb. 4, 2016

(65) Prior Publication Data

US 2017/0133534 A1 May 11, 2017

(30) Foreign Application Priority Data

Nov. 9, 2015 (KR) .................. 10-2015-0156331

(51) Int. Cl.
*F21S 8/10* (2006.01)
*H01L 31/055* (2014.01)
*H01L 31/054* (2014.01)

(52) U.S. Cl.
CPC ........ *H01L 31/055* (2013.01); *H01L 31/0547* (2014.12); *Y02E 10/50* (2013.01)

(58) Field of Classification Search
CPC .... H01L 31/055; H01L 31/0547; Y02E 10/50

USPC ................... 362/317, 84, 230–235
See application file for complete search history.

(56) References Cited

U.S. PATENT DOCUMENTS

| | | | |
|---|---|---|---|
| 8,828,758 B2 * | 9/2014 | Oh ................ | G02F 1/1333 349/123 |
| 9,519,161 B2 * | 12/2016 | Lee ................ | G02F 1/0105 |
| 2011/0090696 A1 * | 4/2011 | Nagai ............. | H01L 33/505 362/293 |
| 2016/0057833 A1 * | 2/2016 | Oh ................ | H05B 33/22 362/235 |

FOREIGN PATENT DOCUMENTS

| | | |
|---|---|---|
| JP | 2013-140900 A | 7/2013 |
| KR | 1020000071241 B1 | 1/2000 |
| KR | 10-2010-0044673 A | 4/2010 |
| KR | 1020100075000 A | 7/2010 |
| KR | 1020110067950 B1 | 6/2011 |
| KR | 10-2015-0061866 A | 6/2015 |

* cited by examiner

*Primary Examiner* — Elmito Breval
*Assistant Examiner* — Jessica M Apenteng
(74) *Attorney, Agent, or Firm* — Goldlocks Zone IP Law (57) ABSTRACT

By virtue of a structure in which patterns have protuberances with a cone-shaped structure and quantum dots are embedded in the protuberances, an optical film prevents the reflection of light, and converts light in the near ultraviolet wavelength region to a range of wavelengths a solar cell can absorb the light, thereby significantly improving the efficiency of a device.

10 Claims, 7 Drawing Sheets

OPTICAL FILM WITH QUANTUM DOTS EMBEDDED IN NANO PATTERNS, A PREPARATION METHOD THEREOF AND SOLAR CELL COMPRISING THE SAME

CROSS-REFERENCE TO RELATED APPLICATIONS

This application claims priority under 35 U.S.C. § 119 to Korean Patent Application No. 10-2015-0156331 filed on Nov. 9, 2015, in the Korean Intellectual Property Office, the disclosure of which is incorporated herein by reference in its entirety.

TECHNICAL FIELD

The present disclosure relates to an optical film with quantum dots embedded in nano patterns, and more particularly, to an optical film with quantum dots embedded in nano patterns that may prevent the reflection of light incidence on a surface, while at the same time significantly increasing an amount of light with 400 nm-480 nm, which is absorbable to solar cell, by converting a wavelength in the UV region from unabsorbable to absorbable, and a preparation method thereof and a solar cell comprising the same.

BACKGROUND

Although a solar cell is a typical environment-friendly device, and the need for sustainable and environment-friendly alternative energy increases, there is a difficulty in commercialization of solar cell due to low efficiency and high costs.

To solve this problem, there are some methods in use, for example, a method which changes or suitably controls the material, thickness or structure of a solar cell, a method which forms an antireflective surface on the surface of a solar cell to increase the amount of light that passes through, a method which converts wavelengths of incident light from unavailable to available for a solar cell, etc.

Among them, the most typical technology for boosting solar cell efficiency is minimization of the reflection of light. And the technology includes the method that deposits materials having different refractive indices in multiple layers on the surface of a solar cell, however, here we have not only some limitations against effectiveness in that the refractive index is likely to be influenced by some conditions of the incidence (wavelength, angle of incidence, polarization, etc.), but also we have some problems about adhesion, stability, or thermal suitability attributable to multiple layers with various materials (Patent Literature 1).

The technology of reflection minimization includes another method that induces a change in effective refractive index by forming a fine grating pattern, called as moth eye structure, on the surface of a substrate to minimize the reflection of light. And this technology can attain very good antireflective characteristics (Patent Literature 2), but such moth eye patterns have optical characteristics greatly depending on the angle of protuberances. So when the nano structures are damaged by mechanical friction, the shape is deformed, and as a consequence, optical transmission and anti-reflective properties greatly reduce. Then, the moth eye nano structures might become a barrier on the application to optical components and optical radiation industries.

Also, having been developed another technology other than reflection minimization for boosting solar cell efficiency, which includes a wavelength conversion layer with an energy down-converting material in order to convert light incidence from too high, unavailable to moderate, available for a solar cell, however, this technology only increases the amount of light in a particular wavelength band, and due to a self-annihilation phenomenon or a surface plasmon resonance (SPR) phenomenon, a larger optical loss occurs, and due to the problem such as increased thickness of the solar cell, there is a limitation in boosting solar cell efficiency.

To overcome the limitation for boosting solar cell efficiency by the wavelength conversion layer, here comes alternative that the wavelength conversion layers are stacked in multiple layers. But as mentioned above, the solar cell efficiency reduces due to various problems occurred by stacking in multiple layers (Patent Literature 3).

RELATED LITERATURES

Patent Literature (Patent Literature 1) Korean Patent No. 10-0822242
(Patent Literature 2) Korean Patent Publication No. 10-2010-0075000
(Patent Literature 3) Korean Patent No. 10-1054394

SUMMARY

The present disclosure is designed to address the above issue, and an object of the present disclosure is to provide an optical film having both an antireflection effect and an optical wavelength conversion effect.

In this instance, the optical film is formed separately from a solar cell with adhesive properties, not formed directly on a solar cell through patternization.

Another object of the present disclosure is to provide a preparation method for mass production of the optical film.

Still another object of the present disclosure is to provide a solar cell including the optical film with excellent optical conversion efficiency.

To achieve the object, the present disclosure provides an optical film including an adhesive member and a pattern layer with protuberance nano-structures which is provided on an upper surface of the adhesive member, wherein a plurality of quantum dots are embedded.

The adhesive member may be a polymer having Young's modulus of 1 to 5 MPa, and the pattern layer may be a polymer having Young's modulus of 6 to 10 MPa.

The adhesive member may be s-polydimethylsiloxane, and the pattern layer may be h-polydimethylsiloxane.

The protuberance structures may be a cone-shaped structure.

The protuberance structures may have an aspect ratio of height (b) to lower width (a) between 1 and 5.

A distance between neighboring topmost ends of the protuberances formed on the pattern layer may be between 350 and 530 nm.

The quantum dots may be at least one selected from the group consisting of CdS, CdSe, CdSe/ZnS, PbS, CdTe, ZnS, ZnSe, ZnTe, GaN, GaP, GaAs, GaSb, AlN, AlP, AlAs, AlSb, InP, InAs, InSb and SiC.

A mean core diameter of the quantum dots may be between 1.0 and 2.5 nm.

The concentration of the quantum dots embedded in the optical film may be between 0.1 and 2 wt % by weight of the pattern layer.

The adhesive member may have a thickness of 50 to 1000 µm.

The pattern layer may have a thickness of 0.1 to 10 µm.

The optical film may emit light with a fluorescence intensity of 10000 to 50000 a.u in a blue wavelength range of 400 to 480 nm under ultraviolet conditions.

To achieve another object, the present disclosure provides a preparation method of an optical film, including the steps of I) preparing a mold having a plurality of cone-shaped recesses on top, II) coating a first polymer solution on the mold to cover the recesses and curing the first polymer solution to form a pattern layer, III) coating a second polymer solution on the entire surface of the pattern layer that is not combined with the mold and curing the second polymer solution to make an adhesive member, and IV) separating the pattern layer from the mold to obtain the optical film.

The step I) may include I-1) coating a single layer of spherical polymer beads on a surface of a silicon substrate, I-2) reducing the diameter of the spherical polymer beads through an etching process, and depositing a metal thin film between the spherical polymer beads to form a mask layer, and I-3) performing plasma or dry etching along the mask layer to prepare a mold having a plurality of cone-shaped recesses on top.

The first polymer solution may be a solution including a polymer having Young's modulus of 6 to 10 MPa and quantum dots, and the second polymer solution may be a solution including a polymer having Young's modulus of 1 to 5 MPa.

The concentration of the quantum dots mixed in the first polymer solution may be between 0.1 and 2 wt % by the total weight of the first polymer solution.

To achieve still another object, the present disclosure provides a solar cell including the optical film formed on a sunlight incident surface or a front surface of the solar cell.

A structure of the solar cell may include a substrate, a rear electrode layer formed on the substrate, a light absorbing layer formed on the rear electrode layer, a buffer layer formed on the light absorbing layer, and a front electrode layer formed on the buffer layer.

The concentration of the quantum dots embedded in the optical film may be between 0.1 and 2 wt % by weight of the pattern layer of the optical film.

The optical film may have a thickness of 50 to 1010 μm.

By virtue of the structure in which patterns have protuberances in the shape of a cone with a blunt end and quantum dots are embedded in the protuberances, the optical film of the present disclosure prevents the reflection of light, and converts light in the near ultraviolet wavelength region to a range of wavelengths where a solar cell can absorb the light, thereby significantly improves the efficiency of a device.

Also, the highly transparent optical film in the present disclosure, because of its adhesion property, can be easily adhered to a device such as solar cells without any additional preparation process, leading to mass production of solar cells at low costs.

Also, the optical film according to the present disclosure is applied through a simple adhesion process to a front surface of a solar cell after the optical film is prepared separately from the solar cell, resulting in significantly improved sunlight absorption efficiency of the solar cell.

Also, the optical film according to the present disclosure is prepared in the form of a film that can be independently adhered to a solar cell, that is to say, the optical film is not patternized directly on the solar cell, so when the solar cell is damaged, or the optical film is damaged, or the life time of either cell or film expires, recycling or replacement of the film is possible.

DETAILED DESCRIPTION OF EMBODIMENTS

Hereinafter, many aspects and various embodiments of the present disclosure will be described in further detail.

Figure 1A:
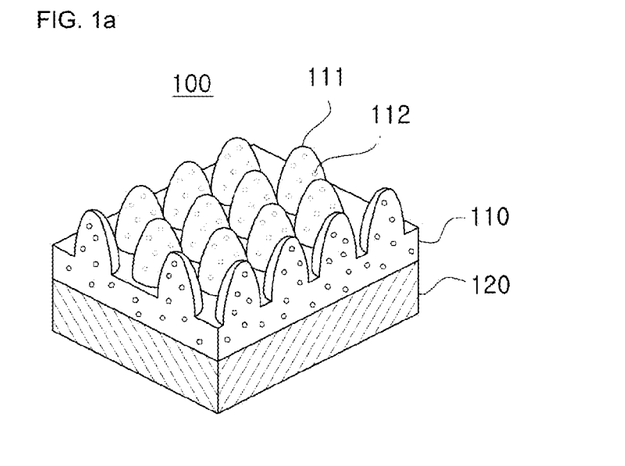
FIG. 1a is a perspective view showing an optical film according to the present disclosure.
Figure 1B:
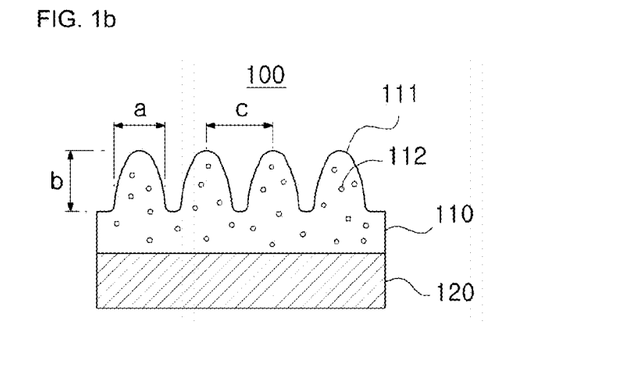
FIG. 1b is a cross-sectional view showing an optical film according to the present disclosure.
Figure 1C:
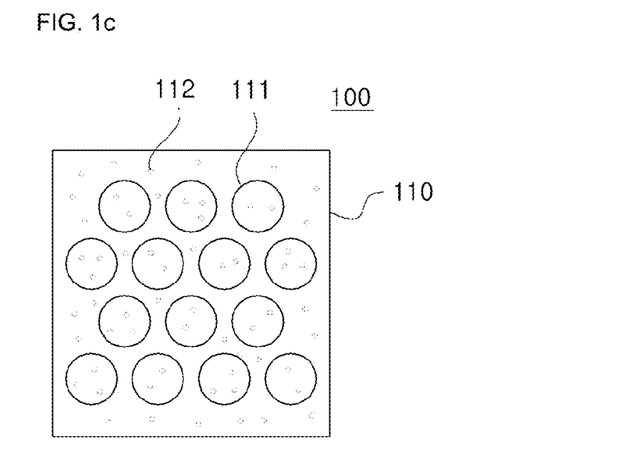
FIG. 1c is a plan view showing an optical film according to the present disclosure.

According to one aspect of the present disclosure, there is provided an optical film including an adhesive member and a pattern layer having a plurality of protuberance structures, provided on an upper surface of the adhesive member, wherein a plurality of quantum dots are embedded in the plurality of protuberances. Its structure is concretely illustrated in FIG. 1.

FIG. 1 is a diagram showing an optical film according to the present disclosure; FIG. 1a is a perspective view, FIG. 1b is a cross-sectional view, and FIG. 1c is a plan view.

Referring to FIG. 1, an optical film 100 according to the present disclosure includes a pattern layer 110 having a plurality of protuberance 111 structures on an upper surface of an adhesive member 120. In this instance, a plurality of quantum dots 112 are embedded in the plurality of protuberances 111.

The adhesive member 120 and the pattern layer 110 may be polymer layers having different mechanical properties such as Young's modulus or flexural rigidity, and different thermal properties such as thermal expansion coefficient, and specifically, the adhesive member 120 may be a polymer having Young's modulus of 1 to 5 MPa, and the pattern layer 110 may be a polymer having Young's modulus of 6 to 10 MPa, which is because the brittleness of the pattern layer 110 having patterns can be compensated with the adhesive member 120 having Young's modulus of 1 to 5 MPa.

Also, the adhesive member 120 is provided on a surface opposite to the surface of the pattern layer 110 where the plurality of protuberances is formed, to allow adhesion to solar cells or various types of devices, while at the same time enhancing poor mechanical properties of the pattern layer 110 as described in the foregoing.

Available polymers for the adhesive member 120 and the pattern layer 110 include, especially, polydimethylsiloxane having adhesive and highly transparent properties, and preferably, the adhesive member 120 may be s-polydimethylsiloxane, and the pattern layer 110 may be h-polydimethylsiloxane.

Generally, due to a low modulus (3 MPa) and high compressibility (2.0 N/mm$^2$), polydimethylsiloxane is vulnerable to deformation under pressure, making it difficult to form patterns on a single layer of polydimethylsiloxane.

Particularly, in forming patterns on a substrate using polydimethylsiloxane as a mold, or in forming patterns on polydimethylsiloxane surface by using a mold, when the patterns are brought into contact with the mold to patternize convex protuberances having a narrow interval and a narrow width with an aspect ratio higher than or equal to 1 as in the present disclosure, there is a tendency to collapse, and in the case of polydimethylsiloxane, an unwanted distortion (sidewall buckling and sagging) occurs in the patterns due to the surface tension when separated from the mold.

Because the size and interval of the protuberances greatly affects the reflection of incident light, when an unintended distortion occurs in the patterns, light transmittance is reduced. Thus, it is not easy to produce a patterned antireflection film by using the same.

Therefore, the present disclosure addressed the above issue, and in an attempt to solve the issue, a composite layer of polydimethylsiloxane having different mechanical properties, rather than a single layer, was used for the adhesive member 120 and the pattern layer 110. By this effort to improve a method of forming patterns on the polydimethylsiloxane surface, the issue was overcome, and the present disclosure was completed.

Other polymer materials may be used for the adhesive member 120 and the pattern layer 110, and in this regard, there is no particular limitation in the choice of polymer material, provided that the above standards (Young's modulus, adhesive property, and transparency) are satisfied, but it is the most desirable to use h-PDMS and s-PDMS to achieve good adhesive properties and high transparency as well as suitable mechanical properties including Young's modulus and flexural rigidity and suitable thermal properties, in order to ensure good elasticity and bending strength in use.

There is no particular limitation in combining adhesive member with pattern layer, provided that the adhesive member 120 and the pattern layer 110 are combined such that an external force caused by deformation applied to the optical film according to the present disclosure is effectively distributed to both the pattern layer 110 and the adhesive member 120 but preferably, the adhesive member 120 and the pattern layer 110 may be combined by the attracting force among molecules within each layer.

Also, more than one connection layer (not shown in FIG. 1) may be further provided between the adhesive member 120 and the pattern layer 110, however, even without additional connection layers, the present disclosure has an effect on improvement in solar cell efficiency to the maximum. That is, dissimilar to a film for antireflection of a conventional solar cell, the connection layer may be omitted in the present disclosure, so efficiency may be maximized even at a very small thickness through a simple adhesion process to a front surface or a rear surface of a solar cell.

The protuberance 111 structures formed on the pattern layer 110 include, but are not limited to, any structure that allows low surface reflectance, but preferably, a cone-shaped structure is the most desirable, which can reduce the surface reflectance of the optical film 100 of the present disclosure by the protuberance 111 structures and thereby prevent strong light scattering.

As described in the foregoing, when the protuberance 111 structures formed on the pattern layer 110 are a cone-shaped structure, the optical film 100 according to the present disclosure can have a further reduction in the surface reflection.

That is, it is the most desirable that the protuberance 111 structures are cone-shaped structures because the surface reflection can be further reduced as compared to other shapes.

In the present disclosure, the term 'cone shape' includes a structure with a pointed topmost end as well as a truncated topmost end, a cone-shaped structure having an end that is cut parallel to a lower base, and a cone-shaped structure with a blunt rounded end.

The protuberance 111 structures may be a structure having a greater height (b) relative to a lower width (a), and specifically, an aspect ratio of height (b) to lower width (a) may be higher than or equal to 1. More preferably, the protuberance 111 structures may have an aspect ratio of height (b) to lower width (a) between 1 and 5. In this instance, when the aspect ratio of height (b) to lower width (a) is less than 1, the antireflection effect is reduced, and when the aspect ratio is higher than 5, the mechanical strength is reduced, causing problems with bending, breaking or agglomeration of the protuberances 111.

More preferably, the protuberance 111 structures may have an aspect ratio of height (b) to lower width (a) between 1 and 2.

To achieve an antireflection effect with a minimum difference in refractive index between the pattern layer 110 and the ambient air through control of a volume ratio of the protuberances 111 formed on the pattern layer 110 to the ambient air, the protuberances 111 formed on the pattern layer 110 should have an aspect ratio higher than or equal to 1, but when the aspect ratio is higher than or equal to 1, there was a problem with damage of patterns such as breaking or cracking.

However, the present disclosure has advantages in that the protuberances 111 formed on the pattern layer 110 have an aspect ratio of height (b) to lower width (a) higher than or equal to 1, and the protuberances 111 are not bent or damaged and maintain the structure to minimize the above-mentioned difference in refractive index.

The protuberances 111 formed on the pattern layer 110 may have a distance (c) between the topmost ends in the range of 350 and 530 nm, and when the distance (c) is less than 350 nm or larger than 530 nm, a ratio of the area of a flat surface of the pattern layer 110 to the whole surface changes depending on the interval between the protuberances 111, and as a consequence, the refractive index at the interface changes, so a refractive index desired by the present disclosure cannot be obtained and antireflective characteristics reduce.

Figure 1D:
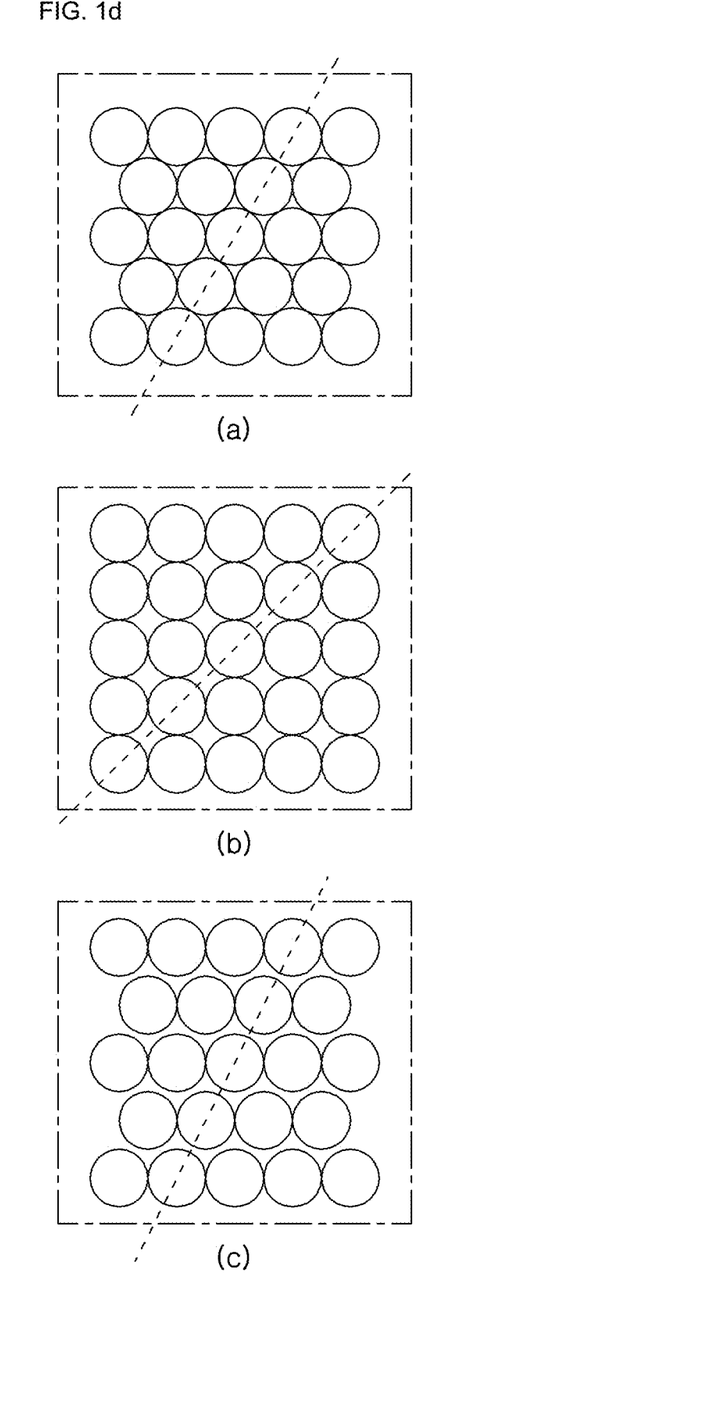
FIG. 1d is a plan view showing an array type of protuberance structures formed on a pattern layer of an optical film according to the present disclosure.

An array of the protuberance 111 structures formed on the pattern layer 110 may be an arbitrary array. For example, the array may be at least one of a cubic close-packed array 1, a hexagonal close-packed array 2 and a random array 3 as shown in FIG. 1*d*. Circles represent the contour of the lower surfaces of each protuberance 111.

Actually, the refractive index is affected by a volume ratio between the protuberances 111 formed on the pattern layer 110 and the ambient air, and the volume ratio between the protuberances 111 and the ambient air can be sufficiently tuned by the aspect ratio of the protuberances 111, but besides, to minimize a difference in refractive index on a surface on which the sunlight is incident, it is desirable to control the array of the protuberance 111 structures formed on the pattern layer 110. As described in the foregoing, to minimize a difference in refractive index of the optical film 100 of the present disclosure, a most preferred array of the protuberance 111 structures formed on the pattern layer 110 is a cubic close-packed array 1.

However, when some ridges (or lower surfaces) of the protuberance 111 structures intersect or come into contact with each other, unfavorably an interference effect therebetween occurs.

The optical film 100 according to the present disclosure preferably has the protuberance 111 structures uniformly arranged throughout the pattern layer 110, and the term "uniform" as used herein particularly refers to a state in which the protuberances 111 are distributed at a substantially uniform density, and indicates that a region where the protuberances 111 are absent is not formed in a part of the pattern layer 110. That is, it stands for a state in which the protuberances 111 are arranged at a uniform distance therebetween, and a specific uniformity is as described below.

The distance (c) between the topmost ends of the protuberances 111 formed on the pattern layer 110, i.e., a cycle (c) of the protuberances 111 formed on the pattern layer 110 may be between 350 and 530 nm, and a standard deviation of a distribution of the interval between the protuberances 111 may be 0.03.

The distance (c) between the topmost ends of the protuberances 111 formed on the pattern layer 110 represents a cycle of the protuberances 111 formed on the pattern layer 110.

The optical film 100 according to the present disclosure has the quantum dots 112 dispersed in the protuberance 111 structures that form the pattern layer, and the term quantum dots (QDs) are nanoparticles in a predetermined size having a quantum confinement effect, and they absorb light (excitation light) having a smaller wavelength than a photoluminescence wavelength of the quantum dots 112 and generate strong fluorescence emission in a narrow wavelength band. Specifically, the quantum dots 112 in the present disclosure absorb light in the ultraviolet (UV) wavelength band and generates blue fluorescence emission in 400 to 480 nm band. In this instance, light is emitted with the fluorescence intensity of 10000 to 50000 a.u, which is the photoluminescence intensity 10 times or more higher than the same volume of conventional quantum dots 112.

That is, excitation light (including UV region) incident on the optical film by the quantum dots 112 is converted to light in a wavelength band in which light is absorbed by solar cells or a device while passing through the pattern layer having the protuberance structures. Preferably, light in the range of ~400 nm may be converted to light in the wavelength region range of 400 nm to 480 nm, and more preferably, 420 nm to 460 nm, and in this instance, the optical film 100 of the present disclosure proposes an improved structure in which the quantum dots 112 are embedded in the pattern layer 110, and it can be seen that the fluorescence emission intensity is significantly increased, which is more than 10 times higher than the same volume of quantum dots 112.

The quantum dots 112 may be at least one selected from the group consisting of CdS, CdSe, CdSe/ZnS, PbS, CdTe, ZnS, ZnSe, ZnTe, GaN, GaP, GaAs, GaSb, AlN, AlP, AlAs, AlSb, InP, InAs, InSb and SiC.

As the core size of the quantum dots 112 is smaller, the photoluminescence wavelength is smaller, and to have the photoluminescence wavelength of 400 nm to 480 nm, the quantum dots 112 preferably have a mean core diameter between 1.0 and 2.5 nm. However, to convert light to the wavelength region that can be absorbed by a solar cell, the mean core diameter of the quantum dots 112 is most preferably between 1.6 and 2.2 nm.

Also, preferably, the quantum dots 112 have a mean core diameter between 1.0 and 2.5 nm and a mean diameter between 5 and 8 nm to have a desired photoluminescence wavelength while not affecting the refractive index through combination with the protuberance 111 structures formed on the pattern layer 110 of the optical film 100.

The concentration of the quantum dots 112 embedded in the optical film may be between 0.1 and 2 wt % by the weight of the pattern layer 110, and when the concentration of the quantum dots 112 is less than 0.1 wt % by the weight of the pattern layer 110, the absolute number of the quantum dots 112 embedded in the optical film 100 is too small when the optical film 100 is applied to a device such as solar cells, making it impossible to expect a wavelength conversion effect of the quantum dots to remarkably increase light absorbed by the pattern layer 110, and when the concentration of the quantum dots 112 is larger than 2 wt % by the weight of the pattern layer 110, the transparency of the optical film 100 is inhibited, resulting in low light transmittance.

The thickness of the adhesive member 120 may be between 50 and 1000 μm, and when the thickness of the adhesive member 120 is less than 50 μm, the optical film 100 prepared later is bent or curled, making it difficult to control, and when the thickness of the adhesive member 120 is larger than 1000 μm, the optical film 100 according to the present disclosure including the quantum dots 112, in particular, the pattern layer 110 is disposed apart from a solar cell, reducing the possibility that light converted by the pattern layer 110 of the optical film 100 reaches the solar cell.

The thickness of the pattern layer 110 may be between 0.1 and 10 μm, and when the thickness is less than 0.1 μm, additional equipment is required to implement and additional costs are needed during the preparation process, causing a loss in an economic aspect, and the absolute number of the quantum dots 112 embedded in the pattern layer 110 is reduced, failing to produce a wavelength conversion effect.

Also, when the thickness of the pattern layer 110 is larger than 10 μm, it becomes opaque and light transmittance is remarkably reduced.

Also, the optical film 100 is characterized by fluorescence emission in the blue wavelength range of 400 to 480 nm, preferably in the wavelength range of 420 to 460 nm under the UV conditions, and as the optical film 100 of the present disclosure proposes an improved structure in which the quantum dots 112 are embedded in the pattern layer 110, it can be seen that the fluorescence emission intensity is increased, which is more than 10 times higher than the same volume of the quantum dots 112.

By embedding the quantum dots 112 in the pattern layer 110 of the optical film 100 according to the present disclosure, it can be seen that not only an antireflection effect but also a wavelength conversion effect are significantly increased by the two elements.

Also, when the optical film 100 according to the present disclosure has the above-mentioned structure, an antireflection effect and a wavelength conversion effect are more than 10 times higher than those when each is used.

Because the optical film 100 according to the present disclosure has adhesive properties, there is no need to go through sintering or a complex preparation process in the process of forming a wavelength conversion layer or an antireflection layer in various types of devices including solar cells by using the optical film 100, thereby suppressing deformation or cracking in the elements of solar cells and various types of devices.

Also, the optical film 100 according to the present disclosure can be easily provided in various types of devices including solar cells through a simple operation of attaching it to the various types of devices by using adhesion, and various types of devices provided with the optical film 100 through this process have improved efficiency because of not only an increased amount of incident light but also an increased amount of light, especially, in a usable wavelength range for the various types of devices.

In other words, when the optical film 100 of the present disclosure is attached to the surface, even solar cells (for example, CIGS solar cells or general solar cells with an antireflection film) with various structures developed to date can have further improved efficiency without a large increase in thickness.

Together with high visible light transmittance and a wavelength conversion effect, because the optical film 100 according to the present disclosure effectively converts a wavelength in a region that does not contribute to the photoelectric effect to a wavelength contributing to the photoelectric effect, it can significantly improve the solar cell efficiency.

Also, because it simultaneously provides a wavelength conversion effect and an antireflection effect within a small thickness, the optical film 100 according to the present disclosure can boost efficiency while minimizing an increase in thickness, when applied to various types of devices including solar cells.

Further, the optical film 100 according to the present disclosure can be adhered to a device in a simple manner by using the adhesive properties, giving big advantages in that it can be re-used and recycled.

Figure 3:
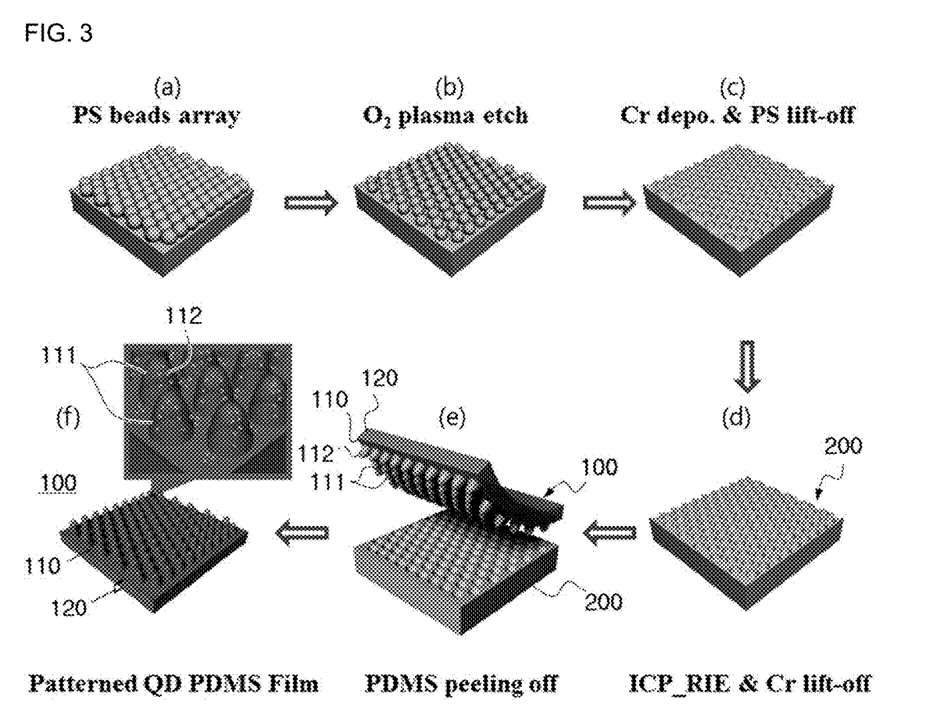
FIG. 3 is a process diagram showing a preparation process of an optical film according to the present disclosure.

Also, another aspect of the present disclosure relates to a preparation method of the optical film, including the following steps:

I) preparing a mold 200 having a plurality of cone-shaped recesses on top;

II) coating a first polymer solution on the mold 200 to cover the recesses and curing the first polymer solution to form the pattern layer 110;

III) coating a second polymer solution on the entire surface of the pattern layer 110 that is not combined with the mold 200 and curing the second polymer solution to make the adhesive member 120; and IV) separating the pattern layer 110 from the mold 200 to obtain the optical film. This overall preparation process is shown in FIG. 3.

Referring to FIG. 3, first, the step I) begins with preparing the mold 200 having a plurality of cone-shaped recesses on top. In this instance, a process of making the mold 200 may use methods known in the art, preferably a photolithography method and a dry etching method.

Specifically, a process of making the mold 200 includes coating a single layer of spherical polymer beads (polystyrene beads are used in the present disclosure) on the silicon substrate ((a) in FIG. 3), reducing the diameter of the beads using inductively coupled plasma or by a dry etching process using $O_2$ gas ((b) in FIG. 3), and forming a mask layer in a gap between the beads using an electronic beam deposition device. In the present disclosure, chrome is used as the mask layer.

Subsequently, the spherical polymer beads are removed from the mask layer ((c) in FIG. 3), and etching is carried out using plasma or dry etching along the mask layer to form a plurality of cone-shaped recesses on top, completing the mold 200 ((d) in FIG. 3).

Subsequently, II) a first polymer solution is coated on the mold 200 to cover the recesses and cured to form the pattern layer 110 ((e) in FIG. 3). Specifically, a first polymer solution is coated to sufficiently cover the recesses on the mold 200, and is cured to form the pattern layer 110.

In this instance, the first polymer solution may be a solution including a polymer having Young's modulus of 6 to 10 MPa, and to remedy the problem with vulnerability to break due to the high hardness of the pattern layer 110 having patterns, a second polymer solution is coated on the entire surface of the pattern layer 110 that is not combined with the mold 200 and is cured to form the adhesive member 120.

Available polymers for the adhesive member 120 and the pattern layer 110 include, especially, polydimethylsiloxane having electrical conductivity, adhesive properties, and highest level of transparency, and preferably, the adhesive member 120 or the second polymer solution may include s-polydimethylsiloxane, and the pattern layer 110 or the first polymer solution may include h-polydimethylsiloxane.

The first polymer solution may include a h-polydimethylsiloxane (hard PDMS) monomer, a catalyst, an initiator and quantum dots, and the second polymer solution may include a s-polydimethylsiloxane (soft PDMS) monomer and an initiator.

However, to create an improved structure of the optical film 100, the first polymer solution further includes quantum dots together with h-polydimethylsiloxane.

The quantum dots 112 may be at least one selected from the group consisting of CdS, CdSe, CdSe/ZnS, PbS, CdTe, ZnS, ZnSe, ZnTe, GaN, GaP, GaAs, GaSb, AlN, AlP, AlAs, AlSb, InP, InAs, InSb and SiC.

As the core size of the quantum dots 112 is smaller, the photoluminescence wavelength is smaller, and to have the photoluminescence wavelength of 400 nm-480 nm, the quantum dots 112 preferably have a mean core diameter between 1.0 and 2.5 nm. However, to convert light to the wavelength region that can be absorbed by a solar cell, the mean core diameter of the quantum dots 112 is most preferably between 1.6 and 2.2 nm.

Further, the mean diameter range of the quantum dots 112 and the mean core diameter range of the quantum dots 112 are preferably in the range between 5 and 8 nm (the mean diameter of the quantum dots 112) and between 1.0 and 2.5 nm (the mean core diameter of the quantum dots 112) to have a desired photoluminescence wavelength while not affecting the refractive index through combination with the protuberance 111 structures formed on the pattern layer 110.

The concentration of the quantum dots 112 mixed in the first polymer solution may be between 0.1 and 2 wt % by the total weight of the first polymer solution, and when the concentration of the quantum dots 112 is less than 0.1 wt % by the total weight of the first polymer solution, the absolute number of the quantum dots 112 embedded in the optical film 100 is too small when the optical film 100 is applied to a device such as solar cells, making it impossible to expect a wavelength conversion effect of the quantum dots to remarkably increase light absorbed by the pattern layer 110, and when the content of the quantum dots 112 is larger than 2 wt % by the total weight of the first polymer solution, the transparency of the optical film 100 prepared therefrom is inhibited, resulting in low light transmittance.

Referring to FIG. 3(d), because they are formed on the pattern layer 110 formed from the first polymer solution via molding by the recesses of the mold 200, the protuberance structures have the substantially same shape as the recesses of the mold. Specifically, the protuberances 111 of the pattern layer 110 may be of a cone-shaped structure having a greater height relative to a lower width.

The overlapped description of the protuberance 111 structures of the pattern layer 110 with the previous description is omitted herein.

Each step of curing the first polymer solution and the second polymer solution may be performed between 50 and 100° C. and through this, the overall process of the present disclosure has an advantage in that it is performed at low temperature.

Finally, IV) the pattern layer 110 is separated from the mold 200 to obtain the optical film 100.

In this instance, to separate the pattern layer 110 of the optical film 100 from the mold 200 without damage, the mold 200 may further include a release layer (not shown).

In the present disclosure, Teflon® is used as the release layer of the mold 200.

Also, to prevent the collapse of the pattern layer 110, the separation process may be performed in an alcohol solution, preferably a methanol solution.

Because the preparation process according to the present disclosure avoids the destruction of the mold 200, in the case where only the mold 200 is already made, the optical film 100 the present disclosure can be prepared with no need to make the mold 200 each time. This overall preparation produces is easy, simple, and not sensitive to preparation conditions, leading to mass production of the optical film 100 according to the present disclosure, and facilitating commercialization.

Figure 2A:
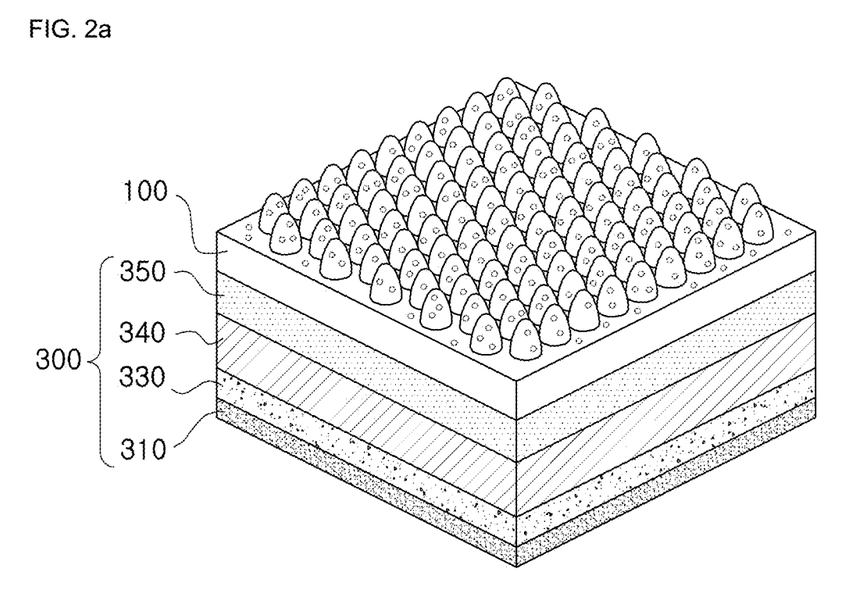
FIG. 2a is a perspective view of a solar cell (with no buffer layer) to which an optical film according to the present disclosure is applied.
Figure 2B:
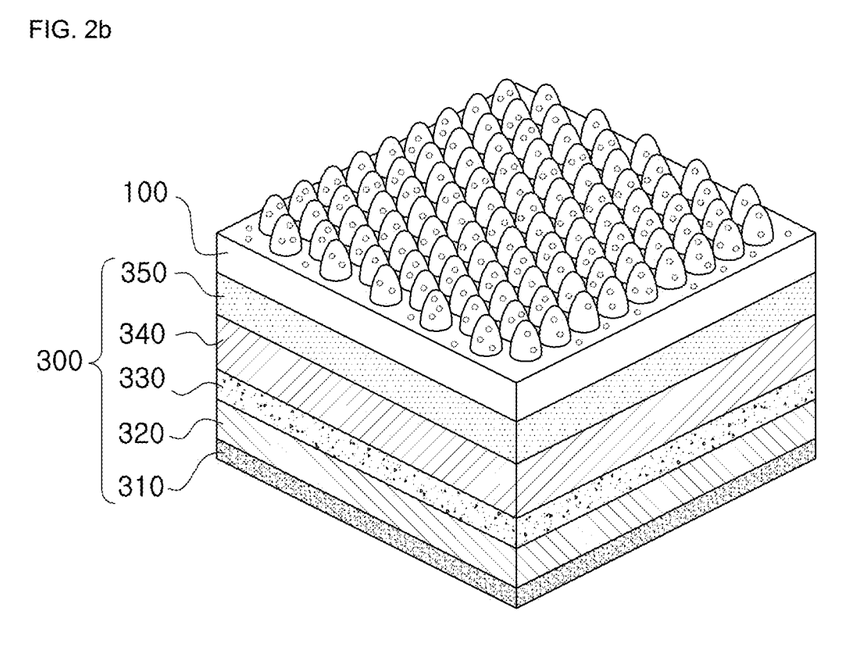
FIG. 2b is a perspective view of a solar cell (with a buffer layer) to which an optical film according to the present disclosure is applied.

Also, still another aspect of the present disclosure relates to solar cells including: a solar cell 300; and the optical film 100 formed on a sunlight incident surface or a front surface of the solar cell 300.

Here, the optical film 100 may be formed by simply joining and adhering it to the sunlight incident surface or front surface of the solar cell 300.

The solar cell 300 absorbs incident light and generates holes and electrons, producing an electric current, and includes, but is not limited to, any type of solar cell commonly used in the art, but may have various structures, for example, based on elemental semiconductors, compound semiconductors and organic semiconductors. Also, the solar cell 300 may include silicon-based, copper indium gallium selenide (CIGS)-based or copper zinc tin sulfide (CZTS)-based or gallium arsenide (GaAs)-based solar cells 300.

An example of the structure of the solar cell 300 is shown in FIGS. 2a and 2b.

Referring to the drawings, the solar cell 300 includes a substrate 310, a first semiconductor layer 330, a light absorbing layer 340, and a second semiconductor layer 350, and the optical film 100 may be formed to cover the sunlight incident surface or front surface of the solar cell 300.

In this instance, the front surface refers to a front surface of a topmost layer that forms the solar cell 300, and in the embodiment of the present disclosure, the optical film 100 may be formed on the second semiconductor layer 350.

The substrate 310 is not limited to a particular material provided that it is a general material used for a substrate in the art, but specifically, may be any one selected from the group consisting of glass, metal, ceramic and polymer, and preferably, the substrate 310 may be a GaAs or Ge substrate, and in the embodiment of the present disclosure, GaAs is used for the substrate 310, and when GaAs is used, the first semiconductor layer 330 and a quantum dot layer as the absorbing layer 340 may be stacked thereon.

The thickness and the area of the substrate 310 is not particularly limited, and proper dimensions may be selected in consideration of the substrate material used and the characteristics of the semiconductor compound.

A buffer layer 320 made from the same material as the substrate may be formed on the substrate 310. The buffer layer 320 may be omitted or added according to the purpose of use of the solar cell 300. FIG. 2a is a perspective view showing the structure of the solar cell 300 according to the present disclosure without the buffer layer 320, and FIG. 2b is a perspective view showing the structure of the solar cell 300 according to the present disclosure including the buffer layer 320.

The solar cell 300 may further include a lower electrode layer 311 on the rear surface of the substrate 310 and an upper electrode layer 351 on the second semiconductor layer 350 (not shown), and the lower electrode layer 311 and the upper electrode layer 351 may be ZnO, Ni, Al, Ti, Ag, Au, Co, Sb, Pd, Cu, TiN, and WN, used singly or in combination. In some cases, their laminated film may be used. The lower electrode layer 311 and the upper electrode layer 351 may be made from the same or different materials. In some cases, transparent conductive materials, for example, transparent conductive oxide (TCO) may be used, and TCO materials may include, for example, indium tin oxide, indium zinc oxide, gallium zinc oxide, aluminum zinc oxide, or combinations thereof.

The lower electrode layer 311 and the upper electrode layer 351 may be formed by low pressure chemical vapor deposition (LPCVD), PECVD, atomic layer deposition (ALD), sputtering, and electron-beam evaporation, and the present disclosure is not necessarily limited thereto.

The first semiconductor layer 330 is formed on the buffer layer 320 or the substrate 310, and may represent an "n-type semiconductor layer" or a "p-type semiconductor layer", and typically has conducting properties opposite to each other to form a junction structure capable of provoking a photoelectric effect when incident light is absorbed by the light absorbing layer in the solar cell structure. For example, the p-type semiconductor may be created by doping a group III-V compound semiconductor with group II elements, and the n-type semiconductor may be created by doping a group III-V compound semiconductor with group IV elements. In this instance, the concentration range of impurity ions in the p-type and n-type semiconductors is not particularly limited.

On the first semiconductor layer 330, the light absorbing layer 340 is formed, and corresponds to an area in which an electron hole pair is generated with sunlight, producing an electric current, and includes at least one quantum dot layer having different energy band gaps.

Also, the light absorbing layer 340 may include at least one group III-V compound semiconductor layer having different energy band gaps (hereinafter, compound semiconductor layer). Each layer of the light absorbing layer 340 is formed with different band gaps to absorb different wavelengths of sunlight, and there is necessarily no limitation on the order or number of layers.

The light absorbing layer 340 may include at least one compound semiconductor layer and at least one quantum dot layer, and in this case, the light absorbing layer 340 may include at least one quantum dot layer on at least one compound semiconductor layer, or may include at least one compound semiconductor layer on at least one quantum dot layer.

Also, the quantum dot layer may be formed between the compound semiconductor layers, and the compound semiconductor layer may be formed between the quantum dot layers.

The light absorbing layer 340 may be formed in a tandem structure by the at least two quantum dot layers.

The light absorbing layer 340 may be formed by stacking the compound semiconductor layer and the quantum dot layer in multiple layers, and in this case, it is desirable to form a tandem structure in which a materials with a largest band gap is placed on the topmost of the light absorbing layer 340, and a material with a smallest band gap is placed on the bottommost (near the substrate).

In this instance, the tandem solar cell refers to a form of solar cell consisting of solar cells having different energy band gaps connected using a spacer (a tunnel junction layer).

The quantum dot layer is composed of quantum dots which are made from group III-V compound semiconductor. The quantum dots may be made from InAs, GaAs, InGaAs, InAlAs, InAlGaAs, InSb, InGaSb, InAlSb, InAlGaSb, InAsN, InGaAsN, InAlAsN, InAlGaAsN, InSbN, InGaSbN, InAlSbN, InAlGaSbN, InAsP, InGaAsP, InAlAsP, InAlGaAsP, InSbP, InGaSbP, InAlSbP, and InAlGaAsP.

The quantum dot layer may be formed by exploiting the Stranski-Krastanov (S-K) mode by which self-assembled quantum dots are grown. Also, the quantum dots may be grown by atomic layer epitaxy (ALE) and a droplet epitaxy method.

The group III-V compound semiconductor layer may be formed from one selected from the group consisting of InAs, GaAs, InGaAs, InAlAs, InAlGaAs, InSb, InGaSb, InAlSb, InAlGaSb, InAsN, InGaAsN, InAlAsN, InAlGaAsN, InSbN, InGaSbN, InAlSbN, InAlGaSbN, InAsP, InGaAsP, InAlAsP, InAlGaAsP, InSbP, InGaSbP, InAlSbP and InAlGaAsP by using molecular beam epitaxy (hereinafter MBE), metal organic chemical vapor deposition (hereinafter MOCVD), liquid phase epitaxy (hereinafter LPE), and a LT-HT method.

The second semiconductor layer 350 is formed on the light absorbing layer 340, and the second semiconductor layer 350 may represent an "n-type semiconductor layer" or a "p-type semiconductor layer", and typically has conducting properties opposite to each other to form a junction structure capable of provoking a photoelectric effect when incident light is absorbed by the light absorbing layer in the solar cell structure. For example, the p-type semiconductor may be created by doping a group III-V compound semiconductor with group II elements, and the n-type semiconductor may be created by doping a group III-V compound semiconductor with group IV elements. In this instance, the concentration range of impurity ions in the p-type and n-type semiconductors is not particularly limited.

The optical film 100 may be provided on the second semiconductor layer 350 or the upper electrode layer 351.

In this instance, the thickness of the optical film 100 may be between 50 and 1010 µm, which results from the thickness of the adhesive member 120 and the pattern layer 110 that form the optical film 100, in which the thickness of the adhesive member 120 is between 50 and 1000 µm, and the thickness of the pattern layer 110 is between 0.1 and 10 µm, and when the thickness of the adhesive member 120 is less than 50 µm, the optical film 100 prepared later is bent or curled, making it difficult to control, and when the thickness of the adhesive member 120 is larger than 1000 µm, the optical film 100 according to the present disclosure including the quantum dots 112, in particular, the pattern layer 110 is disposed apart from a solar cell, reducing the possibility that light converted by the pattern layer 110 of the optical film 100 reaches the solar cell.

Further, when the thickness of the pattern layer 110 is less than 0.1 µm, additional equipment is required to implement and additional costs are needed during the preparation process, causing a loss in an economic aspect, and the absolute number of the quantum dots 112 embedded in the pattern layer 110 is reduced, failing to producing a wavelength conversion effect.

Also, when the thickness of the pattern layer 110 is larger than 10 µm, it becomes opaque and light transmittance is remarkably reduced.

Accordingly, the thickness of the optical film 100 is most preferably between 50 and 1010 µm.

Also, the concentration of the quantum dots embedded in the optical film 100 may be between 0.1 and 2 wt % by the weight of the pattern layer of the optical film 100, and when the concentration of the quantum dots is less than 0.1 wt % by the weight of the pattern layer, the absolute number of the quantum dots 112 embedded in the optical film 100 is too small when the optical film 100 is applied to a device such as solar cells, making it impossible to expect a wavelength conversion effect of the quantum dots to remarkably increase light absorbed by the pattern layer 110, and when the concentration of the quantum dots is larger than 2 wt % by the weight of the pattern layer, the transparency of the optical film 100 is inhibited, resulting in low light transmittance.

Although it will be described later in the following embodiments, as in the above-mentioned structure, when the optical film 100 according to the present disclosure including patterns having an antireflection effect and quantum dots embedded therein is provided in solar cells, the energy conversion efficiency of conventional solar cells is further improved.

Hereinafter, the present disclosure will be described in more detail through embodiments, and the scope and content of the present disclosure shall not be construed as being reduced or limited by the following embodiments. Also, based on the disclosed description of the present disclosure including the following embodiments, it is obvious that those skilled in the art can easily practice the present disclosure in which specific test results are not presented, and it should be understood that such modifications and changes fall within the scope of the appended claims.

Also, only typical test results of examples and comparative examples are presented below, and the effects of each of many embodiments of the present disclosure not explicitly presented below will be specified in the corresponding description.

EXAMPLES 1-5

Preparation of an Optical Film

1) Making of a Silicon Mold.

Polystyrene (PS) beads having a 0.42 µm diameter were prepared using Langmuir-Blodgett technique, and a single layer of the polystyrene beads were coated on a silicon (Si) substrate at a thin thickness. In this instance, the polystyrene was available from CUREBIO and Chloromethyl latex was present in 4% w/v.

Subsequently, inductively coupled plasma (Oxford Etcher) was carried out using $O_2$ gas at a flow rate of 70 sccm for 50 seconds to reduce the diameter of the polystyrene beads.

Thereby, chrome (Cr) was deposited up to 100 nm in gaps between the polystyrene beads using an E-beam evaporator (commercially available from ULVAC).

Subsequently, after the substrate deposited with chrome was immersed in a chloroform solution, polystyrene was removed by sonification treatment, and then, a silicon mold having concave patterns with a cone-shaped structure was made through reactive ion etching (RIE) by an inductively coupled plasma (Oxford Etcher) using mixed gas of argon (Ar) and chlorine ($Cl_2$) for 200 seconds. In this instance, because anisotropic etching should be carried out for the concave patterns with a cone-shaped structure, mixed gas of argon (Ar) and chlorine ($Cl_2$) was used.

The concave patterns with a cone-shaped structure formed on one surface of the silicon substrate had a cone-shaped structure with a blunt end having a lower radius (a) of 246.81 nm and a height (b) of 340.43 nm.

To remove chrome which is a mask layer present on silicon substrate, after the silicon mold having the concave patterns with a cone-shaped structure was immersed in a chrome etching solution prepared by mixing $(NH_4)_2Ce(NO_3)_6$ and $HNO_3$ for 10 minutes, followed by washing with distilled water to remove the chrome, completing the silicon mold having the concave patterns with a cone-shaped structure.

However, to prevent subsequent adhesion of the silicon mold to PDMS which is a main material of an optical sheet, the entire surface of the silicon mold was coated with Teflon®.

2) Production of an Optical Film.

In the case where only s-PDMS is used, an agglomeration problem of s-PDMS occurs in the process of transferring patterns using the mold made through the making process.

Accordingly, to solve the above-mentioned problem and prepare an optical film with a double structure, the present disclosure formed patterns on h-PDMS (hard poly(dimethylsiloxane)) using s-PDMS (soft poly(dimethylsiloxane)) as a support.

First, Vinylmethylsiloxane-Dimethylsiloxane copolymer, trimethylsiloxy terminated (Product Code: VDT-731, Gelest), platinum-divinyltetramethyl-disiloxane complex in xylene (Pt) as a catalyst, 1,3,5,7-Tetravinyl-1,3,5,7-Tetramethylcyclotetrasiloxane (SIT7900.0, Gelest) as a curing agent, and Methylhydrosiloxane-Dimethylsiloxane Copolymers Trimethylsiloxy terminated (HMS-301, Gelest) were respectively added in amounts of 1 g, 5.29 µL, 35.29 mg and 0.29 g in a sequent order to prepare a polymer solution.

Based on the total weight of the polymer solution, quantum dots (440 quantum dots consisting of CdZnS core and ZnS shell) available from NANOSQUARE INC. were mixed for 2 hours so that they were uniformly dispersed, followed by bubble removal with a rotary pump to prepare a first polymer solution. 100 µL of the first polymer solution was spin-coated on the silicon mold at 6000 rpm for 6 minutes without any pre-process, and was cured at 60° C. for 3 minutes.

100 µL of a second polymer solution including s-PDMS was spin-coated on the cured h-PDMS pattern layer at 1000 rpm for 30 seconds, was cured at 90° C. for 60 minutes, and a separation operation was performed in methanol to remove the silicon mold, completing an optical sheet with a double structure of the present disclosure.

At the step of forming the pattern layer in the above-mentioned preparation process of the optical film, the first polymer solution and the quantum dots were respectively mixed at the mixing wt % enumerated in the following table, and using this, each of Examples 1, 2, 3, 4 and 5 was prepared.

TABLE 1

| | First polymer solution (concentration wt %) | |
|---|---|---|
| | Polymer solution | Quantum dots |
| Example 1 | 99.9 | 0.1 |
| Example 2 | 99.8 | 0.2 |
| Example 3 | 99.7 | 0.3 |
| Example 4 | 99.4 | 0.6 |
| Example 5 | 98.8 | 1.2 |

EXAMPLES 6-10

Fabrication of a Solar Cell

Each of the optical films of Examples 1 to 5 was attached (adhered) to a front surface of a gallium arsenide (hereinafter referred to as GaAs) thin film-type solar cell having a size of 0.5 cm×0.5 cm.

The structure of the GaAs solar cell generally includes an n-GaAs buffer layer, an n-GaInP layer, an n-GaAs layer, a p-GaAs layer, a p-GaInP layer and an AR layer ($Si_3N_4$) from an n-GaAS substrate. On the front surface of the solar cell, i.e., the anti-reflection (AR) layer, a layer having antireflection and UV wavelength conversion effects was formed using each of the optical films of Examples 1 to 5.

Because the optical films of Examples 1 to 5 have an adhesive property by the adhesive member provided on the opposite surface of the pattern layer having the patterns, the optical film can be attached by simple adhesion like a sticker without any additional process.

COMPARATIVE EXAMPLE 1

An optical film was prepared in the same way as Example 3 except that quantum dots were not added.

COMPARATIVE EXAMPLE 2

An optical film was prepared in the same way as Example 3 except that a process of forming a pattern using a mold was not performed.

COMPARATIVE EXAMPLE 3

An optical film was prepared in the same way as Example 3 except that a process of forming a pattern using a mold was not performed and quantum dots were not added to a pattern layer (h-PDMS).

COMPARATIVE EXAMPLE 4

Reference

A solar cell was fabricated in the same way as Example 8 except that an optical film was not used.

COMPARATIVE EXAMPLE 5

Flat

A solar cell was fabricated in the same way as Example 8 except that the optical film of Comparative Example 3 was used.

COMPARATIVE EXAMPLE 6

Pattern

A solar cell was fabricated in the same way as Example 8 except that the optical film of Comparative Example 1 was used.

Figure 4:
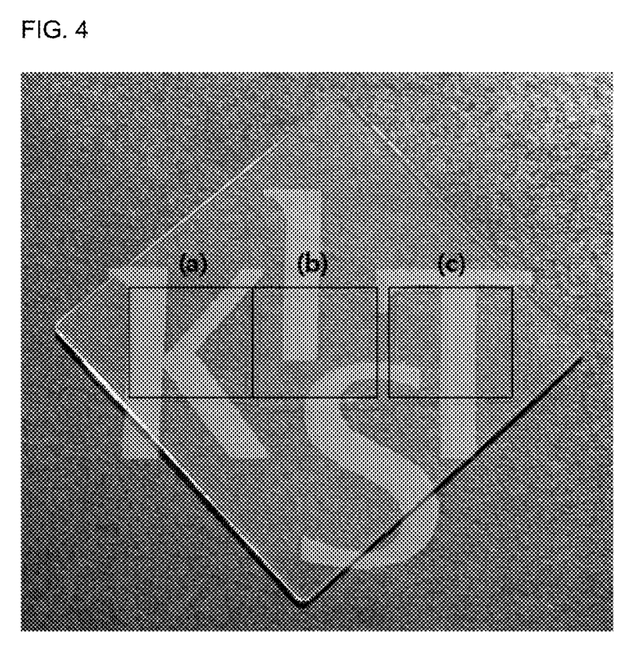
FIG. 4 is a photographic image of actual appearance of an optical film (c) prepared from Example 3 of the present disclosure, an optical film (b) prepared from Comparative Example 1, and an optical film (a) prepared from Comparative Example 3, placed on a quartz substrate.

FIG. 4 is a photographic image of actual appearance of the optical film (c) prepared from Example 3 of the present disclosure, the optical film (b) prepared from Comparative Example 1, and the optical film (a) prepared from Comparative Example 3, placed on the quartz substrate.

As shown in FIG. 4, it was confirmed again that in the case of polydimethylsiloxane, transparency was very good. Further, it can be seen that formation of patterns and quantum dots does not affect the transparency at all. That is, it can be seen that the optical film according to the present disclosure has very good transparency.

Figure 5:
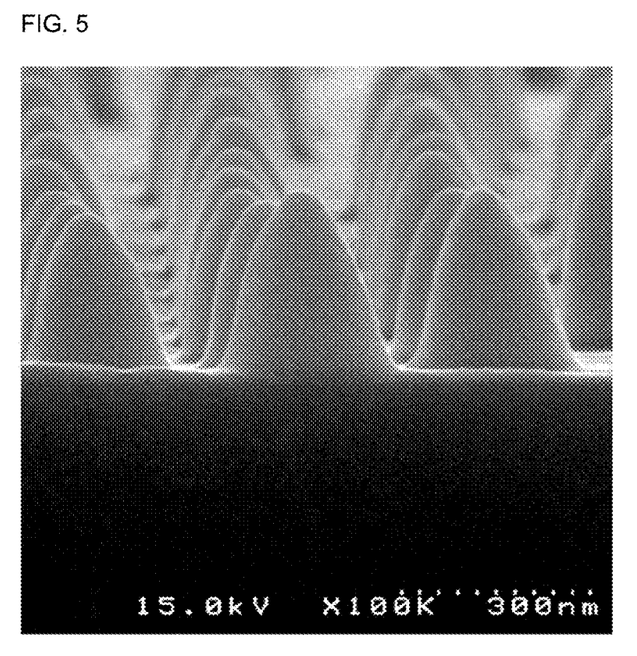
FIG. 5 is a scanning electron microscope (SEM) image of an optical film prepared from Example 3 of the present disclosure.

FIG. 5 is a scanning electron microscope (SEM) image of the optical film prepared from Example 3 of the present disclosure, and the protuberance structures formed on the pattern layer of the optical film according to the present disclosure are arranged very well, and through this, it can be seen that when the preparation method of the optical film according to the present disclosure is used, positioning accuracy is very good.

Further, it was found that the protuberance structures formed on the pattern layer of the optical film according to the present disclosure were in the shape of a cone with a blunt end.

Also, because the optical film prepared through the preparation process according the present disclosure is one single layer, not a combination of the protuberance structures and the pattern layer, there is no risk of separation or release of the protuberance structures.

Figure 6:
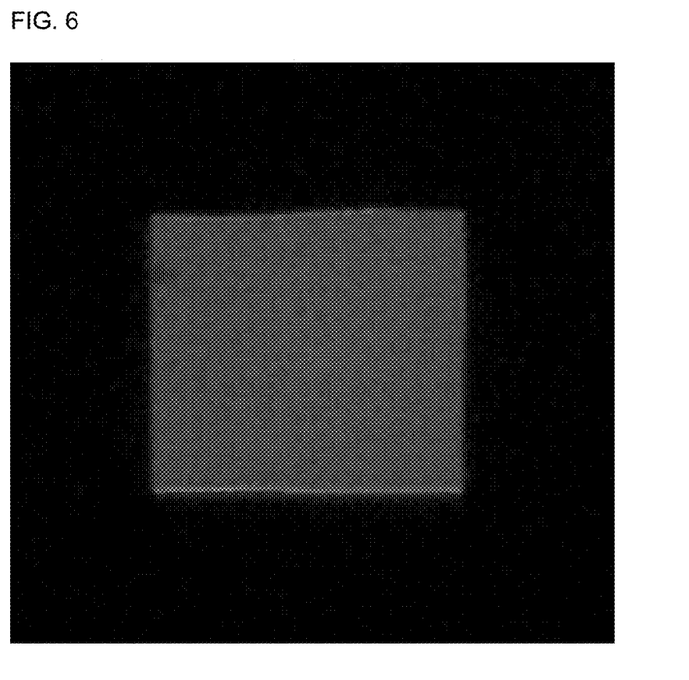
FIG. 6 is a photoluminescent image of an optical film prepared from Example 3 of the present disclosure when ultraviolet (UV) is irradiated.

FIG. 6 is a photoluminescent image of the optical film prepared from Example 3 of the present disclosure when UV is irradiated.

As shown in FIG. 6, it is found that when UV is radiated, the optical film of the present disclosure emits light in the blue wavelength range of 400 to 480 nm.

Figure 7:
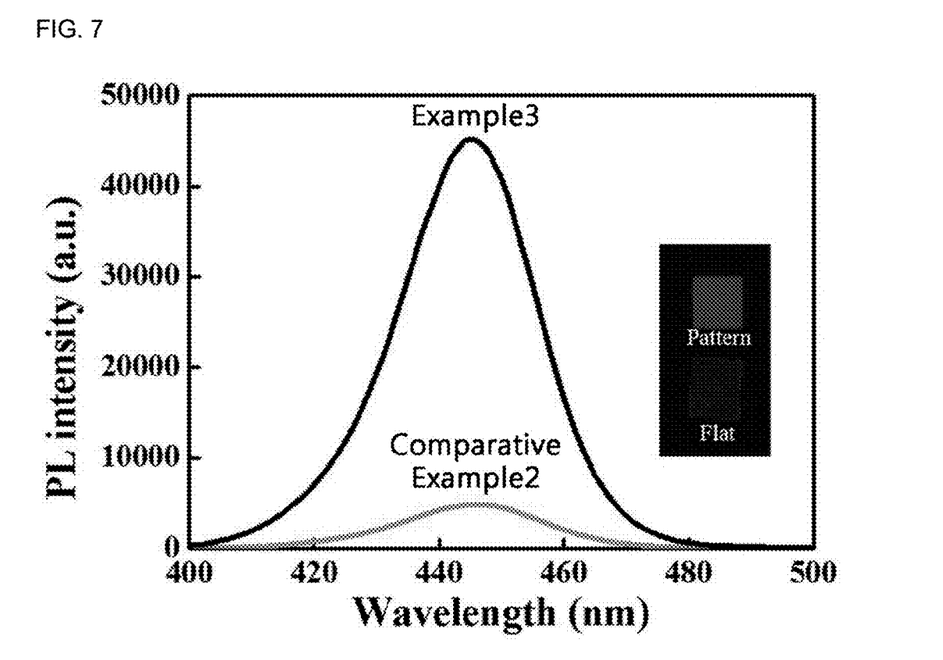
FIG. 7 is a graph showing the measured photoluminescence intensity of quantum dots and a photoluminescent image for each of optical films prepared from Example 3 and Comparative Example 2 when UV is irradiated.

FIG. 7 is a graph showing the measured photoluminescence intensity of quantum dots and a photoluminescent image for each of the optical films prepared from Example 3 and Comparative Example 2 when UV is irradiated.

As shown in FIG. 7, the volume of quantum dots embedded in each of the optical films prepared from Example 3 and Comparative Example 2 is the same, and through this, it can be seen that when quantum dots of the same concentration are embedded in the pattern layer having patterns, the photoluminescence intensity significantly increases, numerically, five-fold to ten-fold increase. This noticeable phenomenon of photoluminescent properties of the quantum dots is beyond an expected range.

Figure 8:
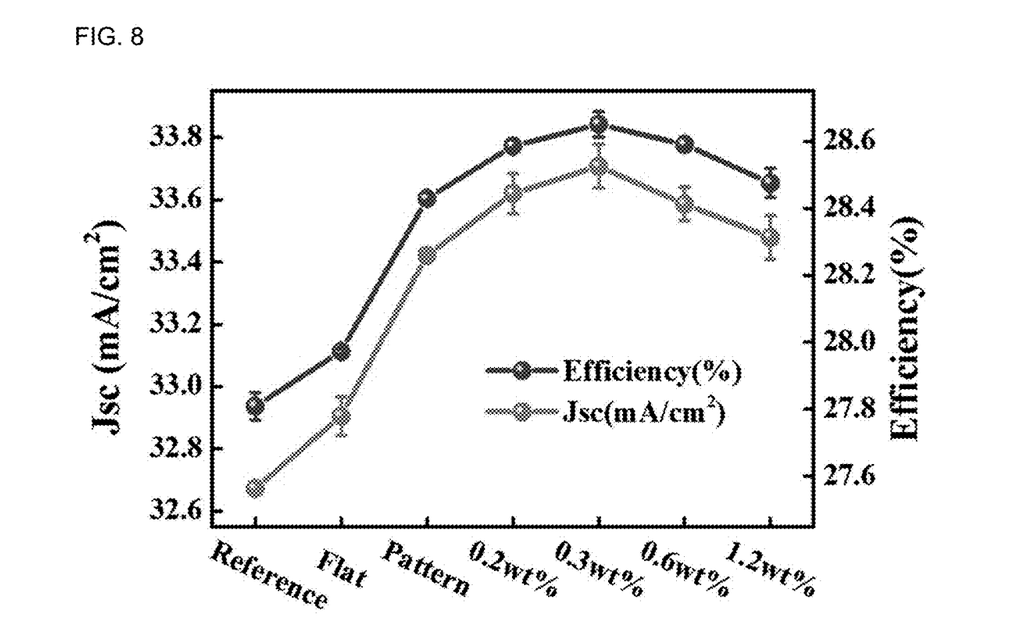
FIG. 8 is a graph showing the measured current density and energy conversion efficiency (efficiency (%)) of solar cells fabricated from Examples 7 to 10 (indicated as 0.2 wt %, 0.3 wt %, 0.6 wt % and 1.2 wt % in a sequential order from Example 7), and solar cells (reference, flat) fabricated from Comparative Examples 4 to 6.

The solar cells fabricated from Examples 7 to 10 (indicated as 0.2 wt %, 0.3 wt %, 0.6 wt % and 1.2 wt % in a sequential order from Example 7), and the solar cells (reference, flat) fabricated from Comparative Examples 4 to 6 were measured to determine the energy conversion efficiency, a current-voltage curve was measured, and the results are shown in FIG. 8. The measurement was made by analyzing the current-voltage curve data, and in this instance, the current-voltage curve was simulated using CHI660A (Electrochemical spectroscopy (EIS)) which is being widely used in the art, and using an AM 1.5 Filter and artificial sunlight from 1000 W Xenn lamp (Thermo Oriel Instrument, USA) which is being widely used to measure solar cells. These results are shown in the following Table 2.

FIG. 8 is a graph showing the measured current density and energy conversion efficiency (efficiency (%)) of the solar cells fabricated from Examples 7 to 10 (indicated as 0.2 wt %, 0.3 wt %, 0.6 wt % and 1.2 wt % in a sequential order from Example 7), and the solar cells (reference, flat) fabricated from Comparative Examples 4 to 6.

TABLE 2

| | $V_{OC}$ (V) | $J_{SC}$ (mA/cm$^2$) | Fill Factor | Efficiency (%) |
|---|---|---|---|---|
| Example 7 (0.2 wt %) | 1.036 | 33.620 | 0.821 | 28.586 |
| Example 8 (0.3 wt %) | 1.036 | 33.789 | 0.820 | 28.719 |
| Example 9 (0.6 wt %) | 1.036 | 33.586 | 0.822 | 28.591 |
| Example 10 (1.2 wt %) | 1.035 | 33.480 | 0.821 | 28.475 |
| Comparative Example 4 (Reference) | 1.035 | 32.673 | 0.822 | 27.809 |
| Comparative Example 5 (Flat) | 1.035 | 32.905 | 0.821 | 27.973 |
| Comparative Example 6 (Pattern) | 1.035 | 33.422 | 0.822 | 28.430 |

As shown in Table 2 and FIG. 8, it was found that as compared to the solar cell (Comparative Example 4) to which an optical film is not applied or the solar cell (Comparative Example 5) using an optical film having no pattern and no quantum dot, in the case of the solar cell (Examples 7-10) to which an optical film having both quantum dots and patterns is applied such as the present disclosure, the energy conversion efficiency increased by about 1% or more.

Also, it was found that as compared to the solar cell (Comparative Example 6) using an optical film having only patterns, the solar cell (Examples 7-10) of the present disclosure had an increase in energy conversion efficiency by about 0.1 to 0.3%.

In this instance, the used solar cell (GaAs) has an improved structure for high energy conversion efficiency, for example, the solar cell is already equipped with an AR layer, so the solar cell has already achieved the increased energy conversion efficiency of 27%.

That is, if the optical film according to the present disclosure is simply attached to even a solar cell having an improved structure, the present disclosure can additionally increase the energy conversion efficiency by about 1% at once, and even 0.1% of an increase in energy conversion efficiency is considerably significant.

Further, it can be seen that because the optical film of the present disclosure increases the energy conversion efficiency up to 1.0% which is double 0.5%, the optical film of the present disclosure achieves a noticeably good effect.

Moreover, in the case of an optical film having only quantum dots, as can be seen from FIG. 7, the photoluminescent properties of the quantum dots are very low, and in the case of the solar cell prepared in the same way as Example 8 using the optical film of Comparative Example 2, the amount of light converted by the quantum dots and incident thereon is significantly reduced, resulting in relatively very low efficiency.

That is, when it is equipped in a solar cell including an antireflection film, it can be seen that the optical film (Examples 7-10) according to the present disclosure has an additional energy conversion efficiency increase effect of greater significance than an optical film including only quantum dots and an optical film having only patterns, and the optical film (Examples 7-10) according to the present disclosure has excellent energy conversion efficiency having great significance of a minimum of 0.1% to a maximum of 1%, as compared to the sum of effects manifested by the optical film having only quantum dots and the optical film having only patterns.

When the effects of the optical film having only quantum dots and the optical film having only patterns are summed up, it can be expected through the results of FIGS. 7 and 8 that a solar cell having the same will rather reduce in energy conversion efficiency.

In a solar cell with an antireflection film having an increase in energy conversion efficiency of this level, in particular, excellent efficiency of 28%, an increase in energy conversion efficiency by a minimum of 0.1% to a maximum of 1% is a quantitatively significant effect.

What is claimed is:

1. An optical film comprising:
    an adhesive member; and
    a pattern layer having a plurality of protuberance structures, provided on an upper surface of the adhesive member,
    a plurality of quantum dots is embedded in the plurality of protuberances,
    wherein the adhesive member has a thickness of 50 to 1000 μm, and the pattern layer had a thickness of 0.1 to 10 μm.

2. The optical film according to claim 1, wherein the adhesive member is a polymer having Young's modulus of 1 to 5 MPa, and the pattern layer is a polymer having Young's modulus of 6 to 10 MPa.

3. The optical film according to claim 1, wherein the adhesive member is s-polydimethylsiloxane, and the pattern layer is h-polydimethylsiloxane.

4. The optical film according to claim 1, wherein the protuberance structures are a cone-shaped structure.

5. The optical film according to claim 1, wherein the protuberance structures have an aspect ratio of height (b) to lower width (a) between 1 and 5.

6. The optical film according to claim 1, wherein a distance between topmost ends of the protuberances formed on the pattern layer is between 350 and 530 nm.

7. The optical film according to claim 1, wherein the quantum dots are at least one selected from the group consisting of CdS, CdSe, CdSe/ZnS, PbS, CdTe, ZnS, ZnSe, ZnTe, GaN, GaP, GaAs, GaSb, AlN, AlP, AlAs, AlSb, InP, InAs, InSb and SiC.

8. The optical film according to claim 1, wherein a mean core diameter of the quantum dots is between 1.0 and 2.5 nm.

9. The optical film according to claim 1, wherein the content of the quantum dots embedded in the optical film is between 0.1 and 2 wt % by weight of the pattern layer.

10. The optical film according to claim 1, wherein the optical film emits light with a fluorescence intensity of 10000 to 50000 a.u in a blue wavelength range of 400 to 480 nm under ultraviolet conditions.

* * * * *